INVENTOR.
KENDALL G. PAULSON
BY Harry R. Lubcke
AGENT

INVENTOR.
KENDALL G. PAULSON
BY Harry R. Lubcke
AGENT

April 29, 1969 K. G. PAULSON 3,441,805

PROCESS AND PRODUCT FOR INTERCONNECTING INTEGRATED CIRCUITS

Original Filed April 15, 1965 Sheet 3 of 3

INVENTOR
KENDALL G. PAULSON
BY Harry R. Lubcke
AGENT

United States Patent Office 3,441,805

Patented Apr. 29, 1969

3,441,805

PROCESS AND PRODUCT FOR INTERCONNECTING INTEGRATED CIRCUITS

Kendall G. Paulson, Santa Ana, Calif., assignor to Electronic Engineering Co. of California, Santa Ana, Calif., a corporation of California Original application Apr. 15, 1965, Ser. No. 448,314. Divided and this application June 28, 1967, Ser. No. 659,257

Int. Cl. H02b *1/04*

U.S. Cl. 317—101 14 Claims

ABSTRACT OF THE DISCLOSURE

An article of minimum bulk for interconnecting plural flat integrated circuits. Plural similar metallic combs have selected fingers and spaced parallel central electrical connections, with attached insulation. Plural integrated circuits are positioned with external connections horizontally aligned with selected fingers of the combs, which fingers are slightly bent vertically and are conductively bonded to the external connections of the integrated circuits. All combs can be positioned on one side of the flat packs, allowing a heat sink to directly contact the same. The interconnected structure can be provided with external connection pins and all save the pins encapsulated. The central connections can be segmented.

Figure 1:
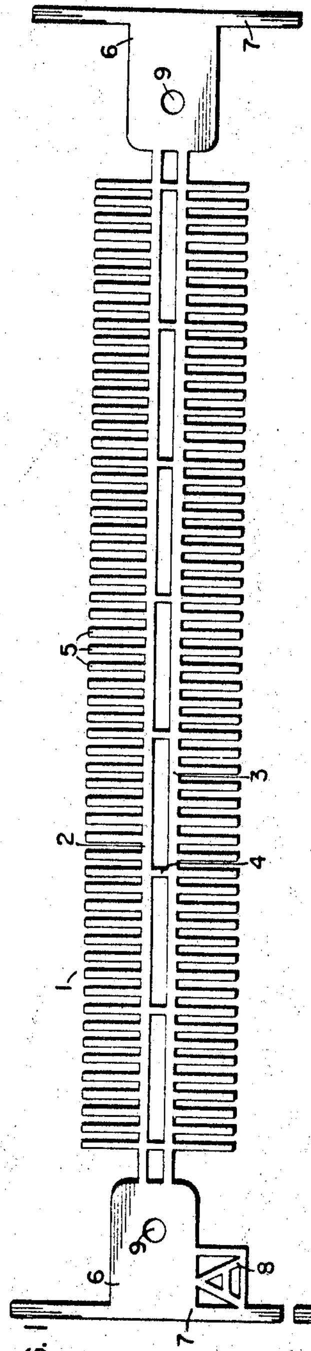

This is a division of application Serial No. 448,314, filed Apr. 15, 1965.

This invention relates to electrically and mechanically interconnecting plural integrated circuit units and more particularly to a process for accomplishing the same and the product which results.

Integrated circuits usually consist of a relatively complete circuit within one unit, such as a flip-flop or a gate. It is necessary to interconnect plural such units if still larger devices are to be fabricated as components of, say, an electronic computer. As an example, four flip-flops and three gates can be interconnected to form a preselected decade module, which module becomes one of many comprising a digital electronic computer.

The saving in space and weight by the use of integrated circuits is well known. Plural transistors, diodes, resistors, and frequently other circuit elements are formed in one relatively small chip of semiconductor material. However, it is necessary to supply a signal input to the integrated circuit, to receive its output, and to supply it with one or more operating voltages in order that it be operative and utilized. Conventional means for making connections; such as plugs, jacks, terminal strips and/or hand wiring, negate the saving in space and weight gained through the use of the integrated circuits.

It is therefore an object of this invention to provide appropriate means for interconnecting integrated circuits and to provide the process required for accomplishing such interconnection. Novel manipulation employing certain jigs is employed according to this invention.

Another object is to employ a prefabricated strip or comb for interconnecting the integrated circuits, which comb has universal application regardless of the particular circuit and of the interconnection required for plural such integrated circuits.

Another object is to employ a prefabricated set of combs, which have connecting fingers in only selected locations, for fabricating a complete module composed of plural integrated circuits.

Another object is to provide a scheme of interconnecting in which systematic connections to common circuits can be attained.

Another object is to provide interconnections to integrated circuits wherein the leads extending from the integrated circuits per se are not bent or otherwise manipulated. This minimizes damage to relatively expensive integrated circuits.

Another object is to provide interconnecting means for integrated circuits which are relatively compact, rugged, light-weight and inexpensive.

Another object is to provide interconnecting means for integrated circuits which may or may not be encapsulated after the interconnecting steps have been accomplished.

Another object is to provide a process and product for interconnecting integrated circuits which are relatively universal in application and which are adapted to interconnecting integrated circuits of differing manufacture.

Another object is to provide a simple set of interconnections for integrated circuits regardless of how many individual connections may be required.

Another object is to provide a process for interconnecting integrated circuits which employs relatively simple set-ups and thus is suitable for short factory runs and even model shop prototypes.

Another object is to provide a process and product for accomplishing interconnections of integrated circuits in which existing resistance welders or brazing or individual soldering techniques as well as laser beam welding may be employed.

Another object is to provide a product for interconnecting integrated circuits in which a variety of type and of placement of external conductors for the completed module can be accomplished.

Another object is to provide a module configuration which allows intimate thermal contact between the integrated circuits and a common heat sink.

Another object is to provide an assembled set of combs having selected fingers to which the external connections of integrated circuits may later be bonded.

It will be noted that the process and product of this invention allows an unexpectedly large flexibility and choice in interconnecting integrated circuits.

Still further objects will become apparent upon reading the following detailed specification and upon examining the accompanying drawings, in which are set forth by way of illustration and example certain embodiments of this invention.

Figures 2, 3:
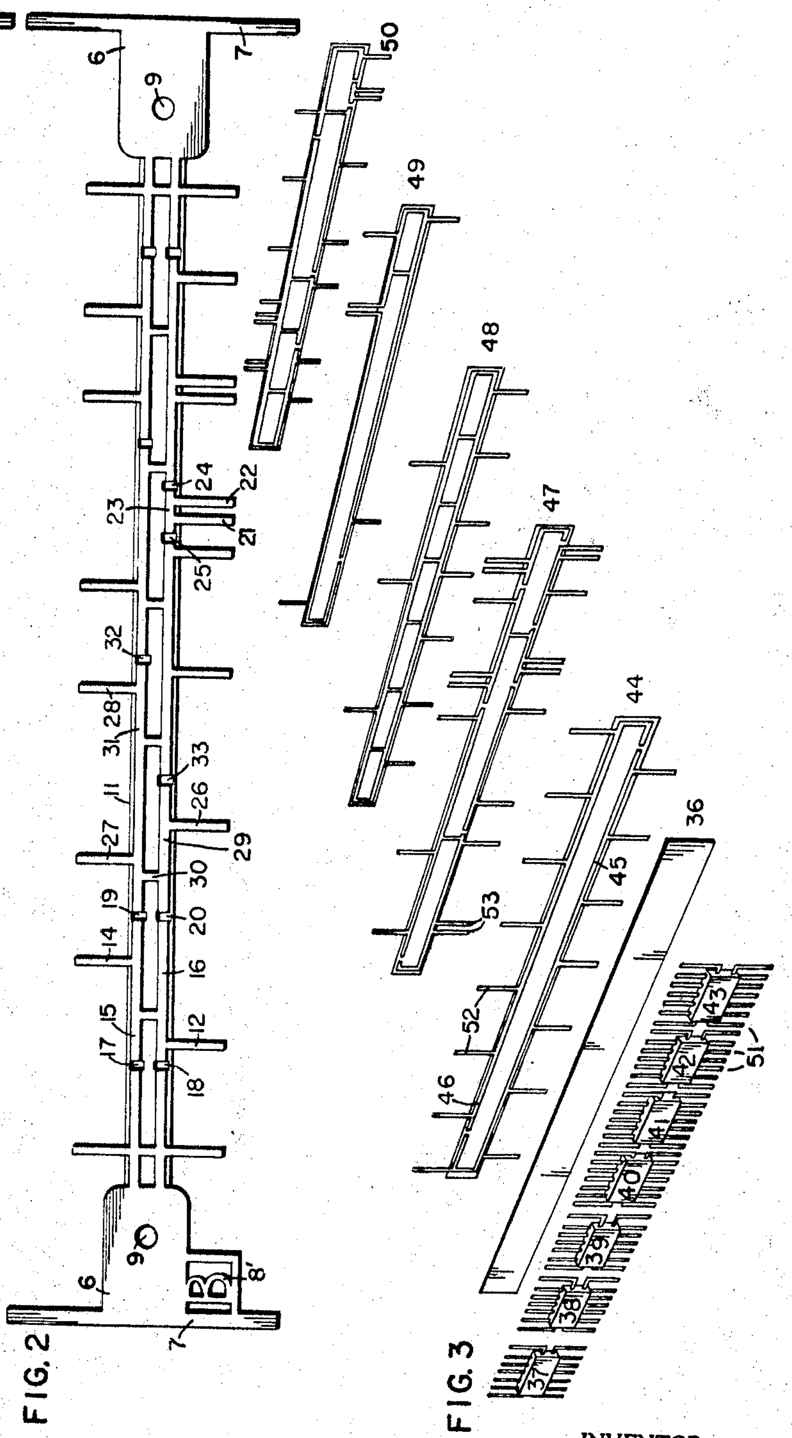
Figure 6:
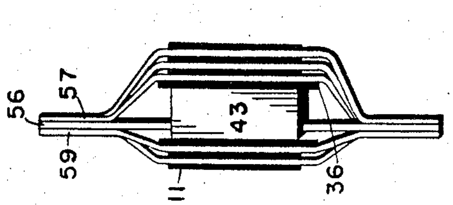
Figure 5:
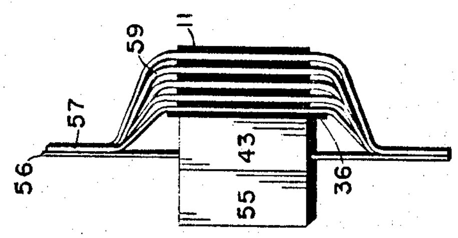
Figure 4:
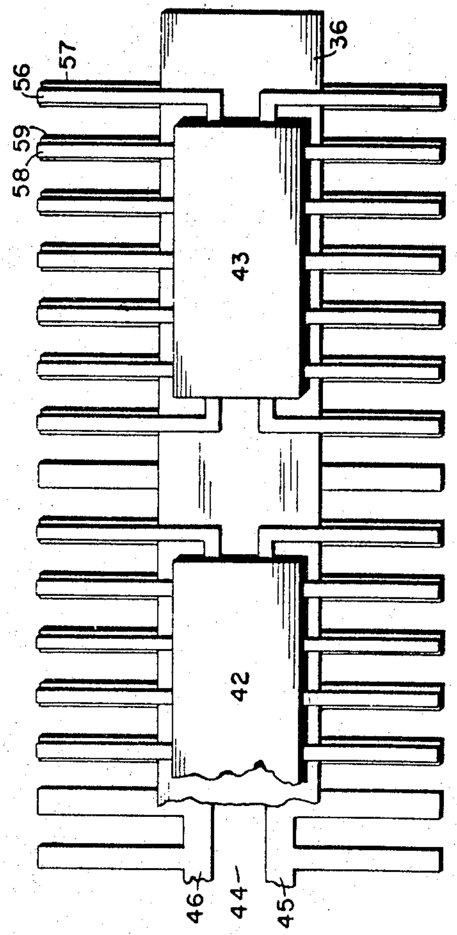
Figure 7:
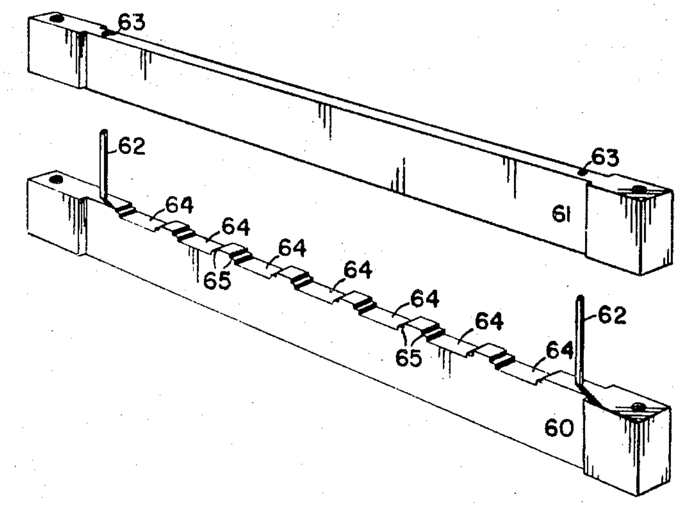
Figure 8:
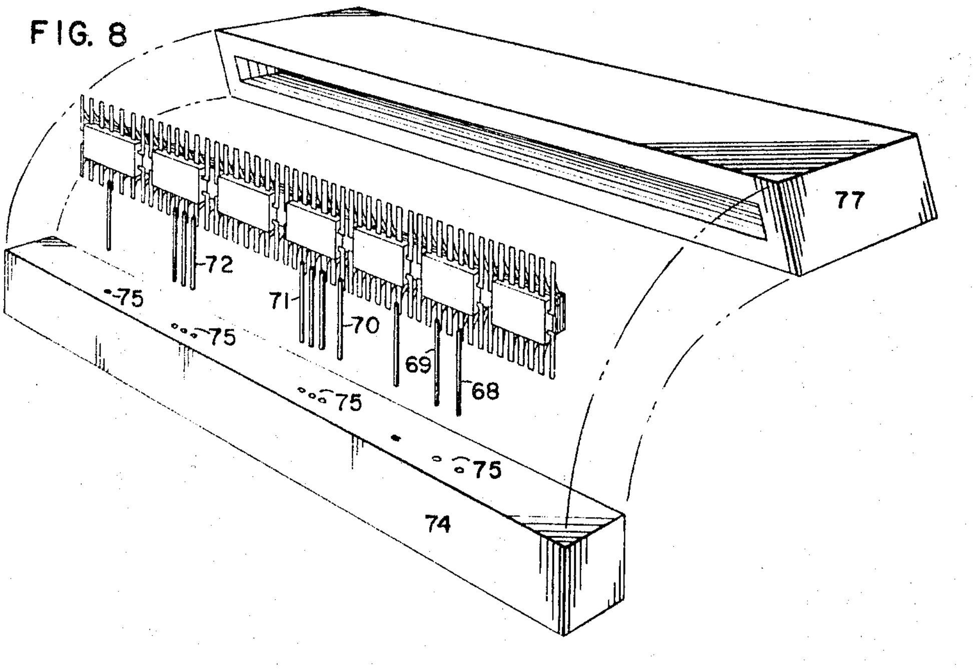

FIG. 1 shows a plan view of one comb of the universal type, as it is initially fabricated, FIG. 2 shows a plan view of one comb having only the fingers with the central axis conductors required for a specific interconnection between plural integrated circuits, FIG. 3 is an exploded perspective view of plural integrated circuits arranged to be interconnected by plural layers of combs, FIG. 4 is a large scale plan view of the detail of the external connections of integrated circuits superposed upon the fingers of plural combs, FIG. 5 is a large scale end view of an embodiment in which all of the combs are disposed upon one side of the integrated circuits and in which a common heat sink is included, FIG. 6 is a large scale end view of an alternate embodiment in which combs are disposed on both sides of the integrated circuits, FIG. 7 is a perspective view of a two part jig employed in the process of assembling the integrated circuits and the interconnecting combs prior to conductively bonding, as by welding, the external connections of the integrated circuits to the fingers of the combs, and FIG. 8 is an exploded perspective view of an encapsulation mold, with the integrated circuits, interconnecting combs and external conductor terminals to the whole assembly also shown.

In FIG. 1, numeral 1 generally indicates a comb according to this invention, being of the universal type as it appears after fabrication. It has two central axis conductors 2 and 3 and plural cross-connecting conductors 4. Additionally, a multiplicity of fingers 5 extend preferably perpendicularly from one side of both central axial conductors.

The spacing of the fingers, one from the next in line, is typically that of the essentially standardized spacing for external connections of integrated circuits. While this standardization is not essential in the practice of this invention, the situation is taken advantage of in the general case. This spacing of 0.050″ from the center of one external connection of an integrated circuit to the adjacent external connection thereof is the most widely standardized aspect of presently manufactured integrated circuits. Even though some integrated circuits have external connections extending out from the ends as well as from the sides of the same, these end connections are formed of L shaped conductive material and provide a connection that is the equivalent of the other connections, which normally extend out each side perpendicularly from the major axis of the integrated circuit. Such an L shaped connection is shown at 56 in FIG. 4.

In FIGS. 1 and 2 the combs shown are over twice actual size, as this invention is normally practiced, so that significant details can easily be seen. It will be noted in FIG. 1 that the width of fingers 5 in each case is equal to the width of the spaces between adjacent fingers; i.e., 0.025″. The width of each central axial conductor and the cross-connecting conductors is also equal to the width of the fingers in a typical embodiment. One cross-connecting conductor is normally provided for each eight fingers along the axis of the comb. This is to accommodate the typical integrated circuit, which has from four to seven external connections extending from each side of the major axis. This provides an extra finger on each side of the comb for each integrated circuit, which can be used to connect to an external circuit with respect to the whole module at a desired position, or from one comb to another in one module for a desired conductive path.

It will be understood that the spacing, number and thickness of the fingers, the number of central axial conductors in excess of two, and the spacing of the cross-connecting conductors, etc., may be varied from the typical embodiment shown in FIG. 1 without departing from the teaching of this invention.

A rectangular part 6 of the conductive structure has a circular aperture 9 and is provided at each end of the comb to facilitate alignment thereof in the assembly processes. This aspect will be further treated in connection with FIG. 7. End bars 7 (FIG. 1) are parts of extended such bars, which connect all of the combs as they are initially fabricated. The letter A at 8 in FIG. 1 identifies the particular comb and the position of that comb in a subsequent assembly, to insure that all combs are assembled with respect to the integrated circuits in the same way. The need for this aspect may not be evident in the symmetrical comb shown in FIG. 1, but it will be understood that this symmetry does not remain when the comb is prepared for interconnecting a given group of integrated circuits, as by removing some of the fingers. Additional combs are fabricated with other letters, as B at 8′ in FIG. 2, and so on, for the purpose of individual identification. The rectangular parts 6 and end bars 7 are normally removed when the module is completed, as it is shown before encapsulation in FIG. 8.

Chemical milling has been found to be a suitable process for fabricating combs. Nickel is a preferred metal for the combs; meeting such requirements as being a resonably good electrical conductor, forming an excellent conductive bond by spotwelding, and being suitable for chemical milling. This process may be accomplished according to the paper, "Chemical Milling of Nickel Matrices," Missel & Allen, published in the magazine "Plating," vol. 49, p. 1076–8, October 1962 by the American Electroplaters' Society, Inc., Newark, N.J., and reprinted for distribution by the Eastman Kodak Co., Rochester, N.Y., who are manufacturers of a suitable resist for metal etching, KMER, for use in the process.

In accomplishing the chemical milling, the known art work is preferably prepared containing a number of individual combs, say nine. The thickness of the nickel material is capable of variation, but a thickness of 0.003″ is preferable. This results in a comb of sufficient strength to provide a rugged module and sufficient flexibility to allow the fingers to be bent over several levels of combs, if required, to make contact with the external connections of the integrated circuit without bending these external connections.

A further step in preparing a comb for subsequent use is attaching a suitable strip of insulation to the axial section thereof. It is essential that the central conductors of one comb not contact those of other combs when the combs are superposed to interconnect the integrated circuits of a whole module. This requirement is evident from elementary electricity.

It is preferable that unwanted fingers upon the universal embodiment of the comb be removed prior to the time that the insulation is attached. This makes it possible to completely remove the unwanted fingers, down to the central axial conductors, so that the strip of insulation, as 11 in FIG. 2, can extend slightly beyond the central conductors on each side of the same and so insure adequate insulation. For prototype work unwanted fingers can be removed with scissors or small metal-cutting shears. For manufacturing, one or more adjacent fingers can be removed at one time with the use of a small shear, manually or power operated. For large quantity production a shear is fitted with multiple blades and all of the unwanted fingers are removed in one shear operation. For this processing it is desirable that guide pins be provided in the shear bed over which apertures 9 of rectangular parts 6 will fit. This insures accuracy in removing unwanted fingers.

It should also be noted that suitable art work can easily be provided for chemical milling in which only desired fingers are formed in the milling process. This alternate embodiment is shown in FIG. 2, as an initially obtained structure. This eliminates the step of mechanically removing unwanted fingers subsequent to the chemical milling operation.

Combs may be fabricated by the metal stamping process by providing a suitable die for either the universal or the specific finger types.

Other suitable materials for the combs include copper and the alloy "Kovar," the latter produced by the Electronics Division of the Carborundum Company. These materials can also be chemically milled or stamped to form the combs. Copper and Kovar may be gold plated for ease in soldering.

A preferred material for the strip of insulation is Mylar, which is manufactured by the Du Pont Company. This material may be of the order of 0.003″ thick. It is attached to the central portion of the comb with a suitable adhesive, such as Eastman 910. Alternately, Mylar with a thermo compression adhesive on one side, type GT300 (0.004″ thick, total) or on both sides, type GT400 (0.005″ thick, total), may be employed. This is manufactured by the G. T. Schjeldahl Co. It is suitably attached to the comb by heating the assembly to 320° F. for 25 minutes, while under pressure. For a comb of typical size Mylar strip 11 may be ⅛″ wide.

Materials other than Mylar may be used for the insulating strip, such as a paper-base phenolic of similar thickness. This material is applied to the metal combs with adhesives such as have been described above.

The next step in fabricating the comb, if it be initially of the universal type, is to punch holes to separate the central axial conductors into separate interconnecting circuits between the integrated circuits, as may be required. For example, when the output connection of one integrated circuit is to be connected to the input terminal of an adjacent integrated circuit, as from finger 12 to finger 14 in FIG. 2, then sections of central axial conductors 15 and 16 must be isolated from all other sections of these conductors. Thus, apertures (holes) 17, 18, 19, 20 are punched or otherwise formed as shown to completely sever the conductors. These are shown square in FIG. 2 and this shape is preferable in regular manufacturing. However, for prototype (one-of-a-kind) construction, round holes may be used on the assumption that round punches are more readily at hand in any shop. It is necessary that the hole be large enough to completely sever the metallic connection, yet not excessively large, since the Mylar backing is also cut away in the process and the strength of the resulting comb is reduced. It is for this reason that a square or a rectangular aperture is preferred.

It has been found that an apertured comb is not fragile because of the toughness of Mylar. In addition, it is only necessary that it be rugged enough for individual handling during fabrication. When a module has been assembled, the staggered locations of the apertures, the conductively bonded connections from integrated circuits to the comb, and the number of combs frequently employed, such as five, produces a sufficiently strong mechanical structure that the module can be wired into a larger assembly without encapsulation, should this be desired.

An example of a different kind of interconnection is shown by fingers 21 and 22 in FIG. 2. Here, a connection between two adjacent external connections in one integrated circuit is required. This is accomplished by the two adjacent fingers in combination with a short section of central conductor 23, the later being isolated by apertures 24 and 25.

A further different kind of interconnection is shown by fingers 26, 27, 28. This is illustrative of one output delivered to two inputs. The section of central conductor 29, cross-connecting conductor 30, and central conductor section 31 provide the interconnection, while apertures 19, 20, 32, 33 isolate these sections of the conductors from other sections of the same.

It is evident that a relatively large number of independent interconnections can be provided by only one comb according to this invention. This versatility is significant as an advance over any other configuration in which conductors cannot be so conveniently segmentized. Of course, where one common connection is required, such as to connect a proper external connection from each integrated circuit to a common voltage supply, this is accomplished according to this invention by a comb without apertures and having such fingers as are needed.

FIG. 3 shows an exploded perspective view of the result of carrying out what has been described with respect to FIG. 2 for each of plural (five) combs, along with an additional strip of insulation 36 and seven flat integrated circuits 37 through 43.

In forming a given module, such as the preselect decade consisting of four flip-flops and three gates, it is desirable to alternate the particular integrated circuits in a manner that requires the fewest interconnections according to this invention. In this instance the proper sequence is not four flip-flops one next to the other and followed by the three gates, but with these elements interposed as follows; flip-flop number one, gate number five, flip-flop two, gate six, flip-flop three, gate seven, and flip-flop four. The interposed arrangement was completely interconnected with five combs, while an earlier segregated arrangement required six combs.

In FIG. 3 the rectangular parts 6 and segments of bars 7 at the ends of each comb have not been shown for sake of clarity although these parts are not removed until the processing in the jig of FIG. 7 or equivalent has been completed. In FIG. 3, element 44 illustrates a voltage supply comb, in which central conductor 45 and connected fingers supply, say, plus twelve volts and central conductor 46 supplies minus twelve volts. Note the apertures at the upper left and the lower right which separate these two voltage buses. On the other hand, central conductor 46 may be used as a common ground connection, as it actually was in the preselect decade, while central conductor 45 is used as a voltage supply bus. This possibility of two extended buses upon one comb indicates the compact structure that can be formed according to this invention.

Comb 47 illustrates interconnections between particular integrated circuits, as was explained in connection with FIG. 2.

Comb 48 was used as a common reset connection for the preselect decade. It may also be used for a clock line, or for a common ground connection.

Comb 49 illustrates a particular semi-common configuration employed for the preselect functioning decade and will be recognized as one of the many types of interconnecting circuits that can be fashioned according to the need for the particular module.

Comb 50 further illustrates an arrangement of relatively isolated interconnections, similar to comb 47, and was required for the preselect decade.

External connections to the integrated circuits per se are shown at 51 in FIG. 3. The spacing of the several fingers, such as 52, 53, etc., on the combs is such that connections 51 overlay particular fingers when the combs and the integrated circuits are held in a jig, such as in FIG. 7.

The situation is detailed in FIGS. 4, 5 and 6.

In FIG. 4 the plan view illustrates integrated circuits 42 and 43 overlaying a plurality of combs, such as the five shown in FIG. 5. While FIG. 4 would also illustrate external connections overlaying the fingers on only one comb, such connections would not be used in practice, since all of the external connections of the integrated circuit would be shorted to one comb. As a practical example, external connection 56 overlays finger 57 on one comb, external connection 58 overlays finger 59 from another comb, and so on.

The additional strip of insulation 36 is preferably placed next to the integrated circuits 42, 43, etc., since the latter are frequently gold plated upon the upper and the lower surfaces as these surfaces are oriented in FIG. 4. With the use of strip 36 thus positioned, the other strips 11 on each comb are positioned toward the outside of the assembly and the outer comb thereby has a strip 11 tending to insulate the module. This serves to protect the comb during fabrication and during use if the module is not encapsulated.

It will be recognized that combs such as 44 and 47 through 50 may be made longer or shorter than shown, thereby to accommodate more or fewer integrated circuits 37 through 43. Likewise, more or fewer combs may be employed than the five shown in FIGS. 5 and 6, depending upon the requirements of the particular circuits. An advantage of the interconnecting mode of this invention is that a minimum of combs are required.

FIG. 5 shows a heat sink 55, which is thermally bonded to the several integrated circuits such as 43, or only to selected such circuits if this should be desired. The heat sink may be a strip of metal, preferably aluminum. It is bonded to the integrated circuits by a thin film of epoxy or heat conductive cement.

The heat sink can be used to enhance the mechanical rigidly of the module and as a mechanical mount when it is made longer than the combs and provide with holes for screws or other mounting arrangements at the ends. In this way numerous modules can be mounted to comprise a larger assembly.

In FIG. 6 a sandwich type relation is employed between the integrated circuits, as 43, and the several combs, which are disposed on both sides of the integrated circuits. This arrangement has the advantage, when a heat sink is not required, of having less extended bending of the fingers as compared with the arrangement of FIG. 5. The arrangement of FIG. 5 has been found to be fully practical, but it is apparent that the arrangement of FIG. 6 is a good one.

FIGS. 4 through 7 will now be discussed by reference to FIG. 7. The jig of that figure has a lower half 60 and an upper half 61. The lower half has guide pins 62, which mate with holes 63 in the upper half. In placing the several combs 44, etc. in place in the jig, the holes 9 in the combs are slipped over pins 62, thereby to bring all of the combs into registration. Prior to this, the several integrated circuits 37–43 are placed in the corresponding number of depressions in lower half 60; viz., depressions 64. Each depression is provided with a step 65 at each end of the depression to accommodate the L shaped external connections of the integrated circuits, such as shown at 56 in FIG. 4.

When the required assembly has been put in place upon the lower half 60, the upper half 61 of the jig is lowered into place by fitting holes 63 over pins 62. The two halves are then held together for subsequent processing steps by screws passing through holes in half 61 into tapped holes in half 60, or by means of a jig vise.

The several fingers 57, 59, etc. of FIGS. 4–6 are then bent into contact with external connections 56, 58, etc., so that each pair may then be conductively bonded. The thickness of the combs in FIGS. 5 and 6 has been exaggerated for sake of clarity. Thus, the rather acute bends shown do not occur in practice. When spot welding is employed to accomplish the conductive bonding the electrodes of the instrument type spotwelder, necessarily employed, bend fingers 57, 59, etc. as the particular weld is made. Equivalent bending and holding together means are required when bonding by soldering, quick brazing or laser beam welding. Parallel gap welding may also be employed. The laser beam welds with the intense energy of collimated coherent light, which is only applied for a brief instant.

For the double-sided configuration of the module according to FIG. 6 the three combs at the right of the figure are connected to the external connections of the integrated circuits first. Then that assembly is taken out of the jig of FIG. 7 and turned over. The additional combs on the other side of the sandwich are then attached in the same manner as the first three.

It will be noted that the external connections to the integrated circuits, 56, 58, etc. are not bent according to this invention. This is desirable since one integrated circuit may cost more than one-hundred times as much as one comb.

An alternate mode of processing consists in forming a unitary structure of combs and thereafter conductively bonding the integrated circuits to the fingers of the combs. In this alternate, the formed, insulated and appropriately punched combs are provided with an additional strip of insulative material, as 36 in FIG. 3, between each of the combs and the whole is bonded together. This is accomplished by providing an adhesive or a thermo compressive adhesive upon the additional strips of insulative material and then clamping or clamping and heating the assembly, as the case may be.

In these steps the alignment pins entering holes 9 (FIGS. 1 and 2) in the clamping jig are preferably 0.003" diameter undersize. This prevents undue stress upon metal comb 1 until the reinforcement provided by the strip of insulative material has been added by the bonding of the same to the comb.

This alternate mode of processing provides an interconnecting package which can be handled as a unit and may even be sent to another factory for the conductive bonding steps of attaching the integrated circuits to the fingers of the combs.

It will be recognized that the structure resulting from a spot weld bond of finger to the external connection of an integrated circuit can be subsequently soldered to in order to provide an external conductor for the module. Thus, the module can be connected to other modules in this manner without encapsulation, or with encapsulation in which the ends of the fingers protrude from the encapsulation on one or both sides.

However, the process and product according to FIG. 8 is to be preferred. In FIG. 8 a plurality of external conductors 68–72 are provided, preferably in the form of lengths of round nickel wire. These are spot welded or otherwise conductively bonded to the extremities of corresponding fingers of the several combs. When this has been accomplished the module is positioned in a sylastic (rubber) block 74 by inserting external conductors 68–72 into the several holes 75 in the block.

A hollow encapsulating mold 77, which may be constructed of sylastic or of aluminum, is brought down over the module and upon block 74 as shown by the dot-dash lines. Normally, mold 77 is brought vertically down upon block 74. A curved path was shown in the figure to provide clarity of illustration of the parts.

The fact that the lower parts of external conductors 68–72 are within block 74 prevents these parts from being covered with encapsulating material and so these remain available for making external connections to the module. The remainer of the module is encapsulated by pouring a liquid encapsulant into the top of the cavity of mold 77, as an illustrative mode of processing. Suitable materials include the Emerson-Cummings type 3050, or type 2651 MM "Stycast" by the same manufacturer.

After the encapsulant has hardened, the encapsulated module is removed from the mold. With the type 3050 encapsulant the module is air cured for one hour and then is oven cured for two hours at a temperature in the range of 150° to 185° F. With the type 2651 encapsulant the module is cured in an oven for four hours at 160° F. Encapsulation may also be accomplished by employing a potting shell of a similar encapsulating material, into which the module is placed and further liquid encapsulant is introduced, or injected. After curing a unitary encapsulation results.

The transfer molding process may also be employed to accomplish encapsulation. The powdered encapsulant is introduced into a heated mold containing the module and pressure is applied by a transfer molding press. Subsequent curing provides a unitary encapsulation as required.

A non-encapsulated module is repairable by breaking off the external connections of the defective integrated circuit and rewelding a new integrated circuit in its place. It has been found that an encapsulated module is similarly repairable after the encapsulation material is cut away from the defective integrated circuit. The latter is located by electrical performance tests, as an initial effort, at least. A transparent encapsulation material can be used, with which a defect may become visible in cases of catastrophic failure. With opaque encapsulation material the location of the defective integrated circuit must be determined from its known position in manufacture.

In addition, the encapsulated module can be slipped into an enclosing metal can for purposes of further protection and/or for heat transmission to a heat sink, etc. The metal can may not touch external conductors 68–72 to prevent electrical shorting, but the can may otherwise enclose the encapsulation. Aluminum is a suitable material for the metal can. With all one side of the module available for external conductors it will be seen that these conductors can be arranged in a systematic pattern without crowding, thus facilitating external connections. Of course, both sides of the module may be utilized for external conductors by suitably forming the structure, suitably encapsulating on both sides in the manner previously set forth for one side, and by providing openings in both sides of a metal can, if the same be used.

Electrical cross-coupling between layers of combs is small because the combs are relatively skeletal in nature. However, if this is to be reduced to a negligible amount it is possible to include shields beween one or more pairs of combs. The shield may have the same form as insulator 36 in FIG. 3 and may be provided with one or more fingers which are connected to the ground or common return circuit, such as conductor 46 in FIG. 3. Each shield is provided with a piece of insulation such as 36 and is preferably slightly smaller in extent than the insulation to prevent unintentional shorting. In the assembly process the shield is stacked with the combs as required with the insulation of the shield against the uninsulated side of the adjacent comb so that the shield will not electrically short the plural conductive patterns on that comb.

It will be recognized that a considerable variation in size, shape and thickness of integrated circuits can be accommodated according to the process and product of this invention without changing the size of the combs as fabricated. Variations in thickness from type to type or manufacturer to manufacturer are accommodated automatically. A larger or a smaller size of the integrated circuit is handled by making the conductive bond farther from or nearer to the central axial conductors. The shape of the integrated circuit is not important, within limits, as long as the external leads thereof generally conform to the standardized spacing. An oval or a round shaped integrated circuit would be treated as both a larger and a smaller size in connecting the one such circuit to the fingers.

Although this invention has been described in its preferred form with a certain degree of particularity, it is to be understood that this disclosure has been made only by way of example, and that various changes in the details of construction and in the combination and arrangement of parts may be made without departing from the spirit and scope of the invention.

I claim:

1. Means for interconnecting plural integrated circuits, each having plural substantially equidistantly spaced external connections, consisting essentially of;

(a) plural flexible combs of conductive material superposed one upon the other, each of said combs having plural axial conductors at a common spacing and each having a plurality of selectively positioned fingers extending from the said axial conductors, (b) a strip of insulative material coextensively attached to each said comb upon said central axial conductors to insulate these conductors of one said comb from the conductors of other said combs, (c) each of said plural combs aligned with selected said fingers thereof overlaying plural selected external connections of said plural integrated circuits, (d) a conductive bond between selected said fingers and said selected external connections, and (e) means to limit the conductive extent of said central axial conductors to interconnect only selected said external connections of said integrated circuits to form an electrically operative module comprised of plural said integrated circuits.

2. The means for interconnecting plural integrated circuits of claim 1 in which;

(a) certain of said plural combs are disposed upon one side of said plural external connections of said plural integrated circuits, and (b) other of said plural combs are disposed upon the other side of said plural external connections of said plural integrated circuits, whereby said plural integrated circuits are sandwiched between said certain and said other plural combs.

3. The means for interconnecting plural integrated circuits of claim 1 in which;

(a) said conductive bond is a weld.

4. The means for interconnecting plural integrated circuits of claim 1 in which;

(a) said conductive bond is a spot weld.

5. The means for interconnecting plural integrated circuits of claim 1 in which;

(a) said conductive bond is a laser-welded joint.

6. The means for interconnecting plural integrated circuits of claim 1 in which;

(a) said conductive bond is a soldered joint.

7. The means for interconnecting plural integrated circuits of claim 1 in which;

(a) said plural central axial conductors and said strip of insulative material upon at least one said comb include plural coincident apertures which completely sever said central axial conductors at selected points, thereby to provide plural separate conductive paths upon a single metallic comb.

8. The means for interconnecting plural integrated circuits according to claim 7 in which;

(a) at least one said plural separate conductive path includes at least one said finger upon one side of said comb and at least one said finger upon the opposite side of said comb.

9. The means for interconnecting plural integrated circuits according to claim 7 in which;

(a) at least one said plural separate conductive path includes plural fingers upon only one side of said comb.

10. The means for interconnecting plural integrated circuits of claim 1 in which;

(a) a cross-connecting conductor coplanarly connects at least two of said plural central axial conductors.

11. The means for interconnecting plural integrated circuits of claim 10 in which;

(a) plural said cross-connecting conductors are spaced apart a given multiple of the spacing of said fingers of said comb.

12. The means for interconnecting plural integrated circuits of claim 1 in which;

(a) a separate insulative strip is disposed between said integrated circuits and the adjacent said comb conductors of said module.

13. The means for interconnecting plural integrated circuits of claim 1 in which;

(a) a conductive shield is disposed between at least two adjacent said combs, and (b) an insulative strip is disposed upon at least one side of said shield to insulate it from the conducting parts of a said adjacent comb.

14. The means for interconnecting plural integrated circuits of claim 1 which additionally includes;

(a) a heat sink thermally conductively attached to one side of said plural integrated circuits, and (b) said plural combs are disposed only upon the side of said plural integrated circuits opposite to that occupied by said heat sink.

References Cited

UNITED STATES PATENTS

| | | |
|---|---|---|
| 3,248,779 | 5/1966 | Yuska et al. |
| 3,311,790 | 3/1967 | Vizzier et al. |
| 3,323,023 | 5/1967 | Walker. |

LEWIS H. MYERS, *Primary Examiner.*

J. R. SCOTT, *Assistant Examiner.*

U.S. Cl. X.R.

339—17